(12) United States Patent
Gill

(10) Patent No.: US 6,469,886 B1
(45) Date of Patent: Oct. 22, 2002

(54) MONOLITHIC INTEGRATED CAPACITOR

(75) Inventor: Hardial Gill, Backnang (DE)

(73) Assignee: Robert Bosch, GmbH, Stuttgart (DE)

( * ) Notice: Subject to any disclaimer, the term of this patent is extended or adjusted under 35 U.S.C. 154(b) by 0 days.

(21) Appl. No.: 09/830,782

(22) PCT Filed: Jul. 22, 1999

(86) PCT No.: PCT/DE99/02252

§ 371 (c)(1),
(2), (4) Date: Aug. 13, 2001

(87) PCT Pub. No.: WO00/28591

PCT Pub. Date: May 18, 2000

(30) Foreign Application Priority Data

Nov. 5, 1998 (DE) .......................... 198 50 915

(51) Int. Cl.⁷ .............................................. H01G 4/228
(52) U.S. Cl. ................. 361/306.1; 361/306.2; 361/330; 257/532
(58) Field of Search .................. 361/306.1, 311–313, 361/321.3, 306.2, 330; 257/532, 533; 427/79, 80; 29/25.03, 25.42

(56) References Cited

U.S. PATENT DOCUMENTS 5,041,889 A * 8/1991 Kriedt et al. ................ 257/362
5,313,693 A * 5/1994 Cachier ....................... 174/52.4

FOREIGN PATENT DOCUMENTS

| EP | 0 317 038 | 5/1989 |
| EP | 0 545 809 A1 | 6/1993 |
| FR | 1524053 | 5/1966 |
| JP | 54159866 | 12/1979 |
| JP | 58101438 | 6/1983 |
| JP | 02140969 | 5/1990 |
| JP | 07074310 | 3/1995 |

* cited by examiner

Primary Examiner—Anthony Dinkins
(74) Attorney, Agent, or Firm—Kirschstein, et al.

(57) ABSTRACT

A monolithic integrated capacitor is formed by two conductive coatings applied to a substrate and separated from each other by a dielectric layer. The upper coating lying on the dielectric layer is connected via at least one conductive air bridge with at least one of a pair of connection lines of the capacitor. Parasitic inductances of the capacitor are largely compensated by connecting the two connection lines together by at least one high resistance line bridging the capacitor.

11 Claims, 1 Drawing Sheet

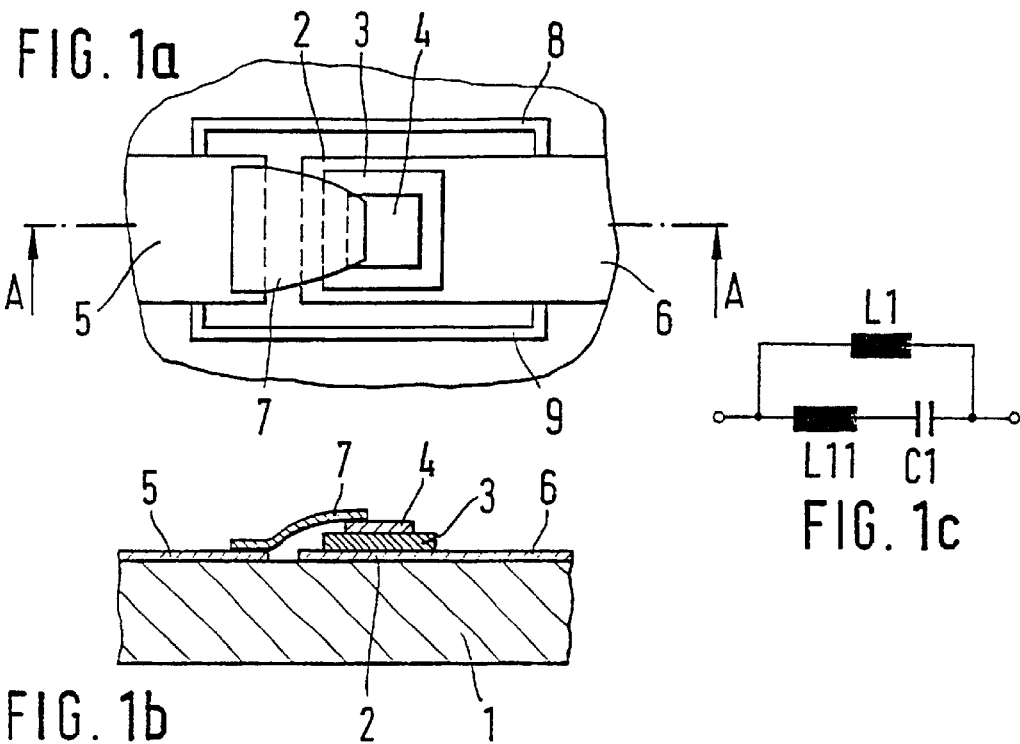
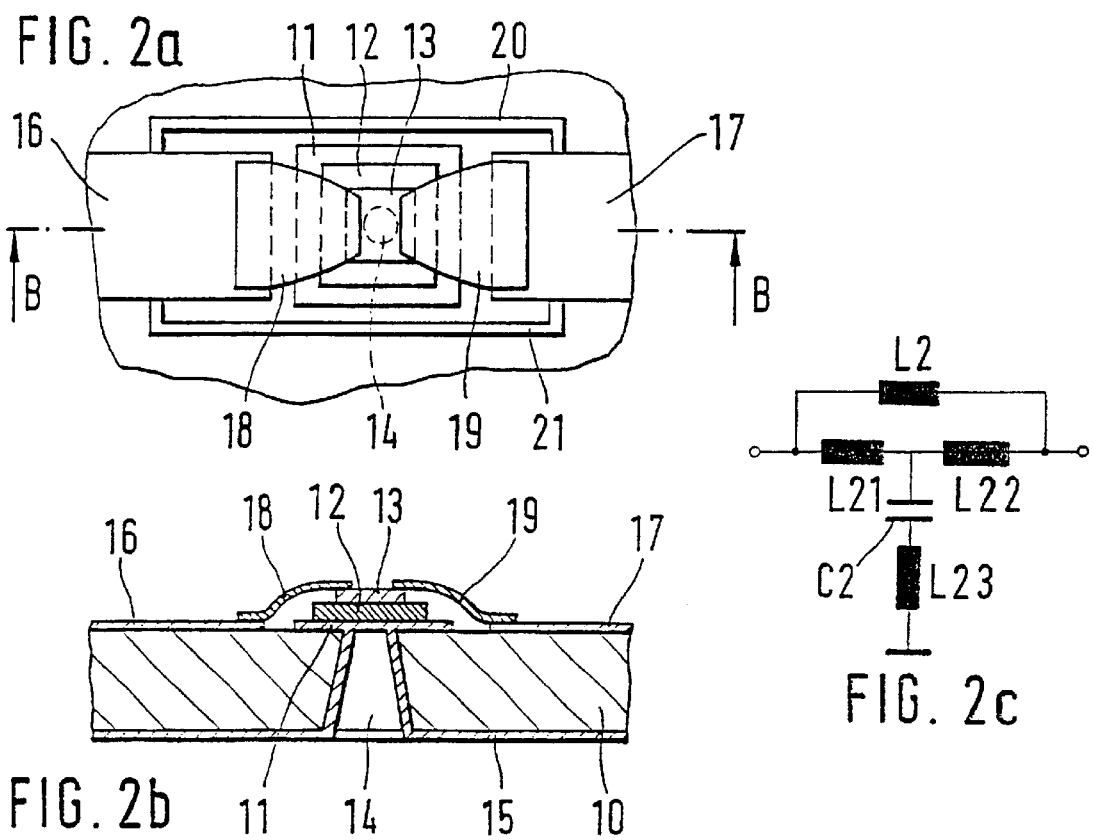

MONOLITHIC INTEGRATED CAPACITOR

STATE OF THE ART

The present invention concerns a monolithic integrated capacitor, the electrodes of which are formed by two conductive coatings applied to a substrate and separated from each other by a dielectric layer, where the upper coating lying on the dielectric layer is connected with at least one of the two connection lines of the capacitor via at least one conductive air bridge. Such a monolithic integrated capacitor is disclosed in "Design Guide, GaAs Foundry Services" by Texas Instruments, Version 4.2, February 1997, pages 1–6.

At very high frequencies e.g. in the millimetre wave range, monolithic integrated capacitors do not have purely capacitative properties like concentrated capacitors, but under certain circumstances they also have a very high inductive reactance. This inductive part results mainly from one or more conductive air bridges which connect a coating of the capacitor with a connection line. The smaller the capacitor, i.e. the smaller the dimensions of the coatings on the condenser, the greater the distance to the connection lines and the longer the conductive air bridges must be made. However the longer the conductive air bridges, the greater the parasitic inductive part of the reactance.

The invention is therefore based on the task of creating a monolithic integrated capacitor, where the parasitic inductive part of the reactance is as small as possible.

ADVANTAGES OF THE INVENTION

The said task is solved by the features of claim 1 in that the two connection lines are connected together by at least one high resistance line bridging the capacitor. This line constitutes an inductive reactance which is connected parallel to the other parasitic inductive reactances. The entire inductive part of the capacitor reactance is thus substantially reduced.

According to the sub-claims, the monolithic integrated capacitor can be formed either as a series-connected element where the upper coating is connected via a conductive air bridge to one of the two connection lines and the lower coating lying under the dielectric layer goes over directly into the other connection line. Or the monolithic integrated capacitor can form a shunt to earth where the lower coating is brought into contact via a through contact in the substrate to an earth line present on the opposite substrate side and the upper coating is connected with both connection lines via a conductive air bridge in both cases.

DRAWING

The invention is now explained in more detail with reference to the design examples shown in the drawings. These show:

FIG. 1a a top view of a series-connected capacitor,

FIG. 1b a cross-section A—A of the capacitor shown in FIG. 1,

FIG. 1c a substitute circuit diagram of this capacitor,

FIG. 2a a top view of a capacitor forming a shunt to earth,

FIG. 2b a cross-section B—B of the capacitor shown in FIG. 2a, and

FIG. 2c a substitute circuit diagram of this capacitor.

DESCRIPTION OF DESIGN EXAMPLES

FIG. 1 a is a top view and FIG. 1b a cross-section A—A through a monolithic integrated capacitor on a substrate 1 (e.g. GaAS substrate). As the substitute circuit diagram shown in FIG. 1c of the monolithic integrated capacitor shows, this is a series-connected capacitor C1.

The monolithic integrated capacitor consists in the known manner of a lower coating 2 applied directly to the substrate 1 which forms the first electrode of the capacitor, a dielectric layer 3 applied to this and an upper coating 4, applied to the dielectric layer 3, which forms the second electrode of the capacitor. Also affixed to substrate 1 are a first connection line 5 and a second connection line 6. In the capacitor, formed here as a series-connected element, the lower coating 2 goes over directly into the connection line 6. The second connection line 5 is connected electrically conductively with the upper layer 4 via a conductive air bridge 7. The conductive air bridge 7 is for example designed as gold strips.

The conductive air bridge 7 causes a parasitic inductive reactance which in the substitute circuit diagram in FIG. 1c is connected as an inductance L11 in series with the capacitor C1. This parasitic inductance L11 can be largely compensated by an inductance L1 connected in parallel to the parasitic inductance L11 and capacitor C1. Such a compensating inductance L1, as shown in FIG. 1a, is created by connecting the two connection lines 5 and 6 together by at least one high resistance line 8, 9 bridging the capacitor. Depending on the value of the parasitic inductance to be compensated, under some circumstances a single line 8 or 9 may suffice. For larger parasitic inductances however it is recommended, as shown in the embodiment in FIG. 1a, to provide two lines 8 and 9 bridging the capacitor. The size of the parasitic inductance L11 essentially depends on the length of the conductive air bridge 7. The length of the conductive air bridge 7 is greater, the smaller the capacitor i.e. the smaller the upper coating 4. The smaller the upper coating 4, the greater the distance to be bridged between it and the connection line 5. The entire inductive part of the monolithic integral capacitor becomes very low if the inductance L1 of the high resistance lines 8 and 9 is very much smaller than the parasitic capacitance[1] L11 of the air bridge 7.

[1] German text uses "Kapazität" here although L11 should be an inductance (Inductivität).

FIG. 2a shows a top view, FIG. 2b a cross-section B—B and FIG. 2c a substitute circuit diagram of a monolithic integrated capacitor which forms a shunt to earth. The integrated capacitor has a lower coating 11 applied to a substrate 10, over this a dielectric layer 12 and applied to this an upper coating 13. The lower coating 11 and the upper coating 13 form the two electrodes of the capacitor. The lower coating 11 is brought into contact via a through contact 14 in the substrate 10 with an earth line 15 on the side of the substrate opposite the lower coating 11. On the same substrate side on which coatings 11 and 13 of the capacitor are applied, are two connection lines 16 and 17 which are each connected via a conductive air bridge 18 and 19 with the upper coating 13 of the capacitor.

The two conductive air bridges 18 and 19, as shown in the substitute circuit diagram in FIG. 2c, constitute two parasitic inductances L21 and L22. The through contact 14 also has an inductive effect which in the substitute circuit diagram is shown as the parasitic inductance L23 connected in series with capacitor C2. The entire inductive reactance of the monolithic integrated capacitor can be very considerably reduced by means of an additional inductance L2 connected in parallel to the other parasitic inductances. This additional inductance L2 is achieved by means of one or two high resistance lines 20, 21 which connect together the two connection lines 16 and 17.

What is claimed is:

1. A monolithic integrated capacitor, comprising:
   a) a substrate;
   b) a lower conductive coating applied to the substrate and forming one electrode of the capacitor;
   c) a dielectric layer applied to the lower coating;
   d) an upper conductive coating applied to the dielectric layer and forming another electrode of the capacitor;
   e) a pair of conductive connection lines applied to the substrate;
   f) at least one conductive air bridge for connecting the upper coating with one of the connection lines; and
   g) at least one high resistance line bridging the capacitor and connecting the connection lines together.

2. The capacitor of claim 1, and further comprising another high resistance line bridging the capacitor and connecting the connection lines together.

3. The capacitor of claim 1, wherein said at least one bridge is a gold strip.

4. The capacitor of claim 1, wherein the connection lines are connected in series with the capacitor, and wherein the lower coating merges directly into the other of the connection lines.

5. The capacitor of claim 1, wherein said at least one bridge has a parasitic inductance in series with the capacitor, and wherein said at least one high resistance line has a compensating inductance in parallel with the capacitor and compensating for the parasitic inductance.

6. The capacitor of claim 1, and further comprising another conductive air bridge for connecting the upper coating with the other of the connection lines.

7. The capacitor of claim 6, and further comprising a conductive contact for connecting the lower coating to ground.

8. The capacitor of claim 7, wherein the substrate has one surface on which the coatings and connection lines are applied, and an opposite surface having a ground plane; and wherein the contact extends between the surfaces of the substrate.

9. The capacitor of claim 8, wherein the contact has a contact inductance in series with the capacitor and ground, and wherein each air bridge has a parasitic inductance; and wherein said at least one high resistance line has a compensating inductance in parallel with the parasitic inductances and compensating for the parasitic inductances and the contact inductance.

10. The capacitor of claim 9, and further comprising another high resistance line bridging the capacitor and connecting the connection lines together.

11. The capacitor of claim 1, wherein each connection line has a width, and wherein said at least one high resistance line has a width less than the width of a respective connection line.

* * * * *